United States Patent
Miyajima

(10) Patent No.: US 7,236,230 B2
(45) Date of Patent: Jun. 26, 2007

(54) EXPOSURE APPARATUS AND DEVICE FABRICATION METHOD

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 88 days.

(21) Appl. No.: 10/827,851

(22) Filed: Apr. 20, 2004

(65) Prior Publication Data

US 2004/0212792 A1    Oct. 28, 2004

(30) Foreign Application Priority Data

Apr. 22, 2003   (JP)   ............................. 2003-116911

(51) Int. Cl.
G03B 27/42   (2006.01)
G02B 7/02    (2006.01)

(52) U.S. Cl. ........................ 355/53; 359/819

(58) Field of Classification Search .................. 355/53, 355/72, 75; 359/811–824; 396/529–530
See application file for complete search history.

(56) References Cited

U.S. PATENT DOCUMENTS

| | | | |
|---|---|---|---|
| 5,572,563 A * | 11/1996 | Kasumi et al. | 378/34 |
| 5,610,684 A * | 3/1997 | Shiraishi | 355/55 |
| 5,646,714 A * | 7/1997 | Morimoto et al. | 355/55 |
| 5,768,038 A * | 6/1998 | Emura | 359/824 |
| 5,973,863 A * | 10/1999 | Hatasawa et al. | 359/823 |
| 6,400,516 B1 * | 6/2002 | Spinali | 359/819 |
| 6,449,106 B1 * | 9/2002 | Spinali | 359/811 |
| 6,469,844 B1 * | 10/2002 | Iwase et al. | 359/819 |
| 6,757,051 B2 * | 6/2004 | Takahashi et al. | 355/67 |
| 6,867,848 B2 * | 3/2005 | Ebinuma et al. | 355/75 |
| 2002/0163741 A1 | 11/2002 | Shibazaki | |

FOREIGN PATENT DOCUMENTS

| JP | 2000-091207 | 3/2000 |
|---|---|---|
| JP | 2002-203767 | 7/2002 |

* cited by examiner

Primary Examiner—Henry Hung Nguyen
(74) Attorney, Agent, or Firm—Morgan & Finnegan LLP

(57) ABSTRACT

A support apparatus includes an optical element, a first support member that supports the optical element, and a second support member that contacts the optical element or the first support member and positions the optical element, wherein the optical element is removably attached to the second support member, or the optical element and the first support member are removably attached to the second support member.

11 Claims, 15 Drawing Sheets

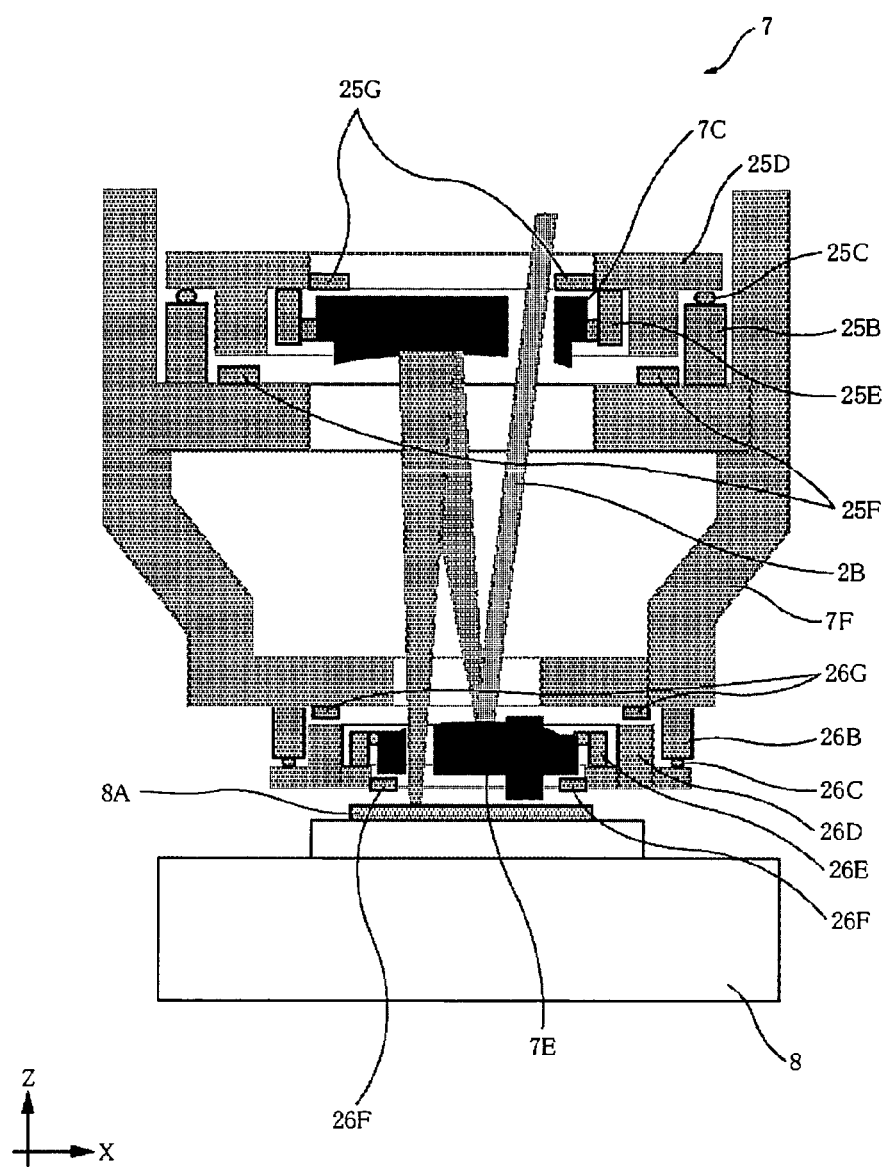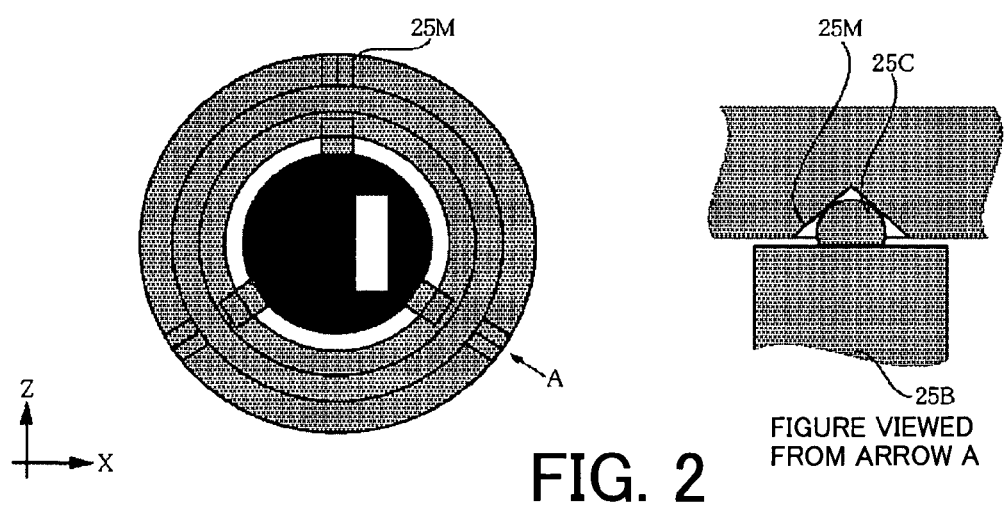
FIGURE VIEWED FROM ARROW A
FIG. 2

MEASUREMENT ITEMS IN MIRROR SYSTEM
DISPLACEMENT MEASUREMENT ARITHMETIC CIRCUIT
(1) BETWEEN MIRROR BARREL AND MIRROR ELEMENT
DISPLACEMENT MEASUREMENT
BY DISPLACEMENT MEASUREMENT MEANS (XYZ)
AND SETTING ORIGIN FOR DRIVING RELATIVE TO MIRROR BARREL
(2) BETWEEN MIRROR ELEMENT AND MIRROR
DISPLACEMENT MEASUREMENT
BY DISPLACEMENT MEASUREMENT MEANS (XYZ)
AND SETTING ORIGIN FOR DRIVING RELATIVE TO MIRROR ELEMENT
(3) BETWEEN PROJECTION OPTICAL SYSTEM BODY AND MIRROR ELEMENT
MIRROR ELEMENT DISPLACEMENT MEASUREMENT
BY DISPLACEMENT MEASUREMENT MEANS (XYZ)
(4) BETWEEN PROJECTION OPTICAL SYSTEM BODY AND MIRROR
MIRROR DISPLACEMENT MEASUREMENT
BY DISPLACEMENT MEASUREMENT MEANS (XYZ)

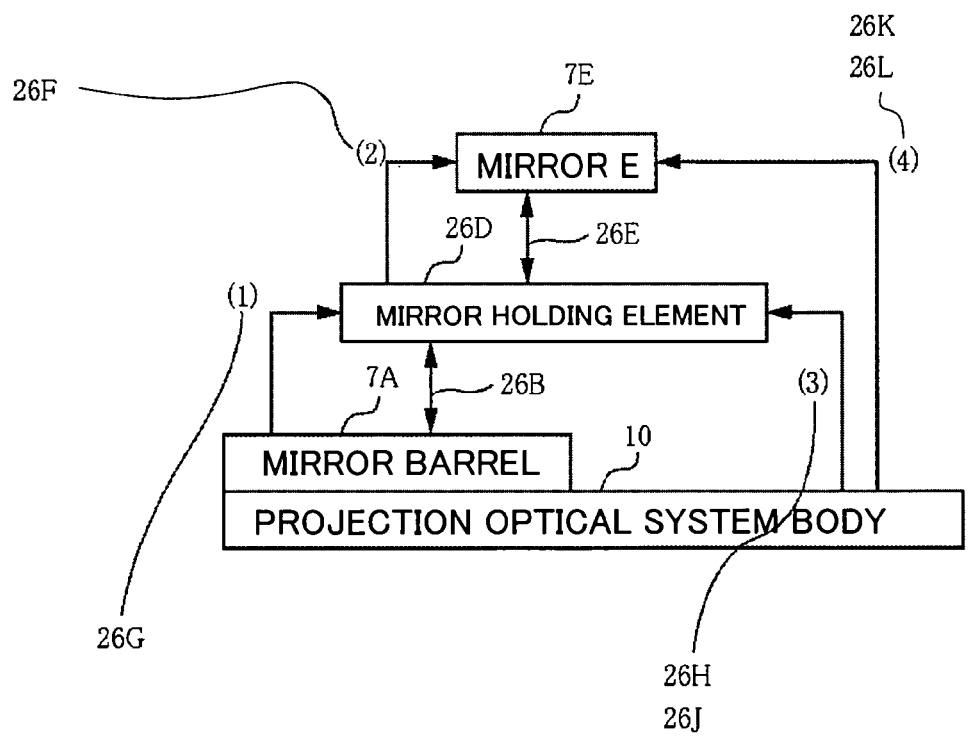

FIG. 4

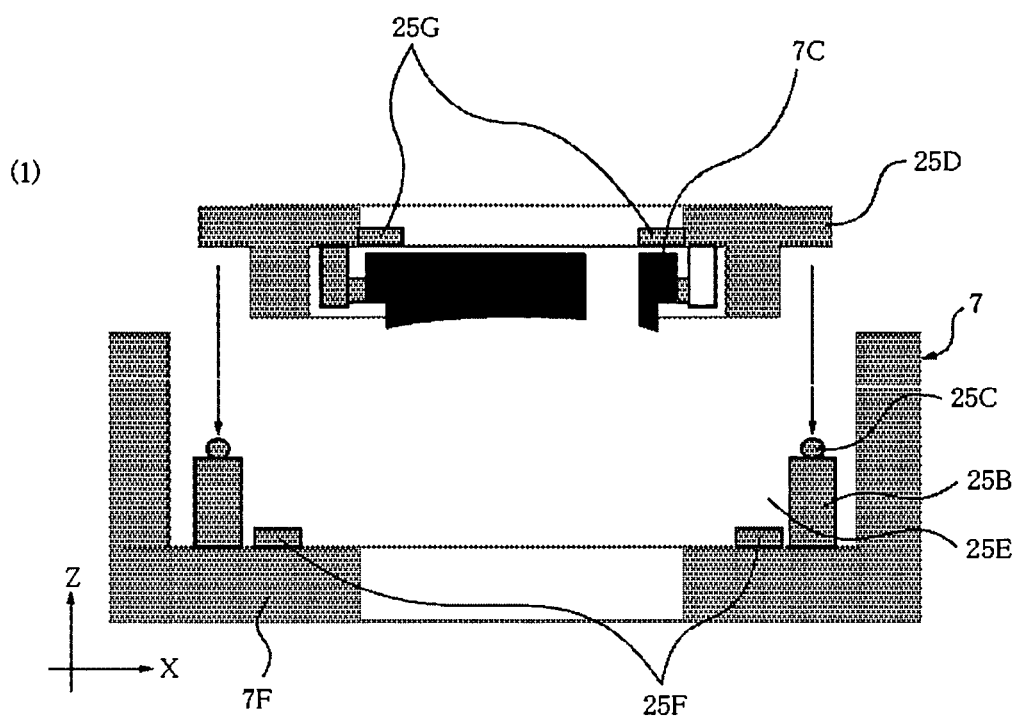
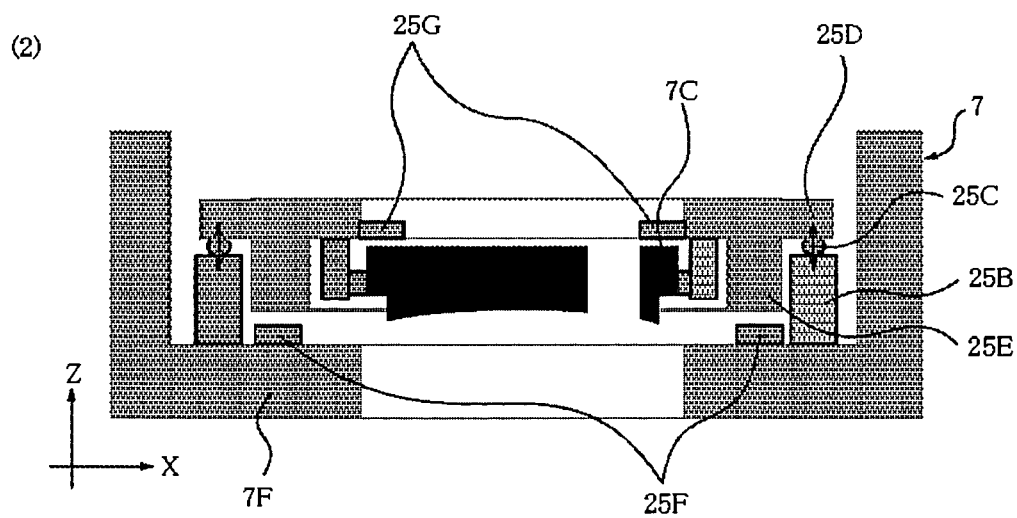
FIG. 7

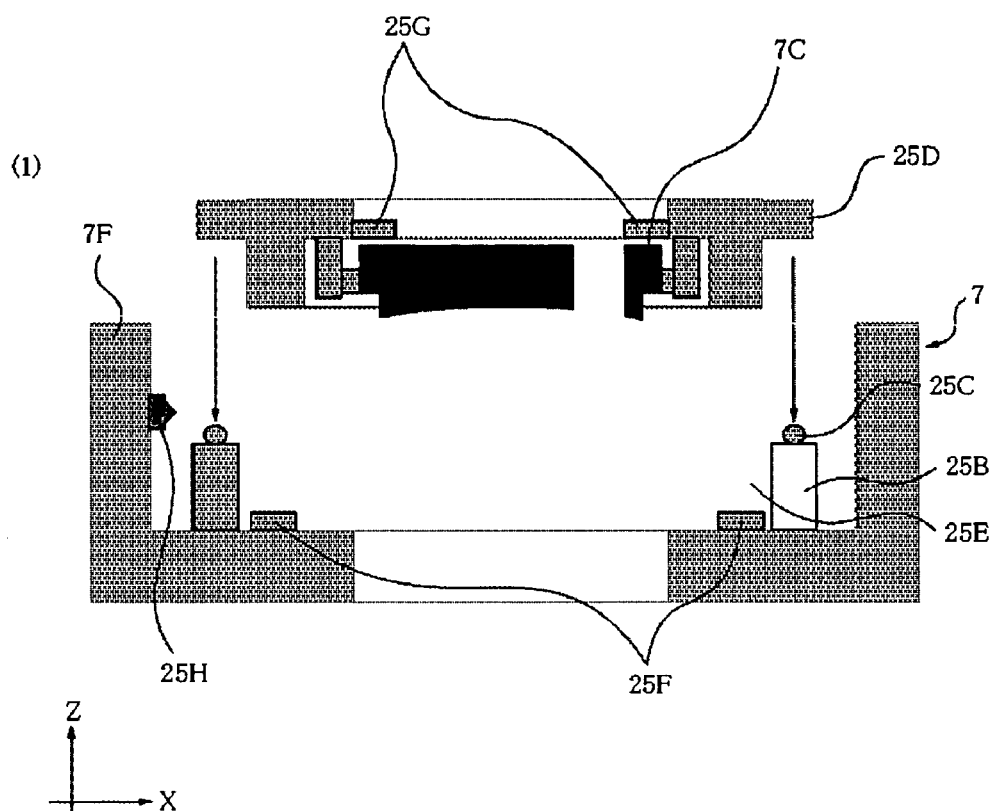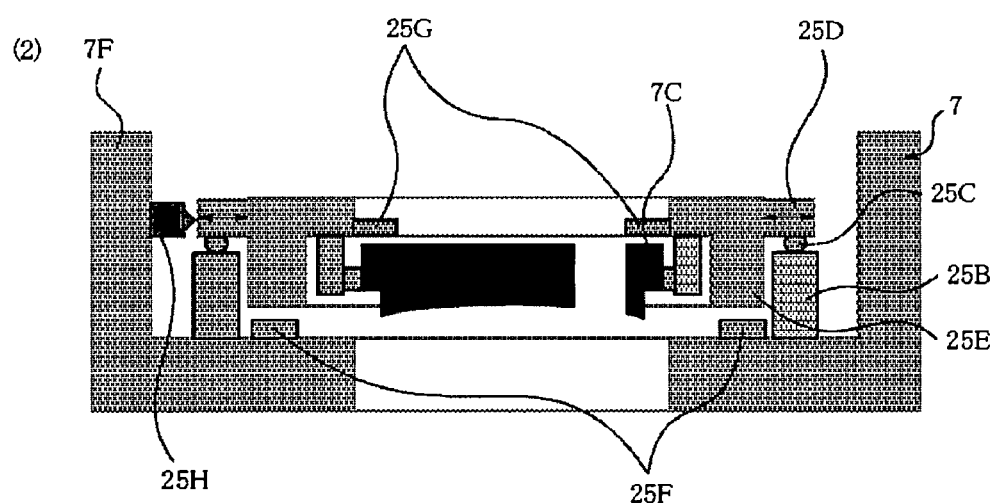
FIG. 8

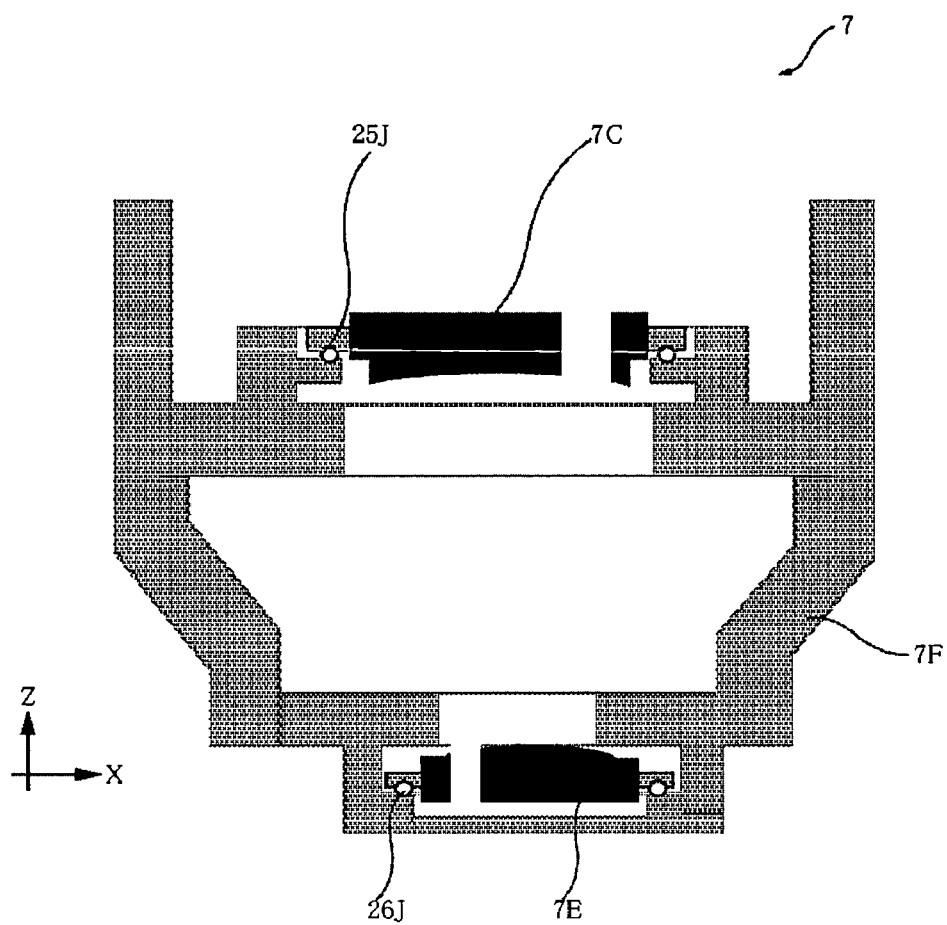
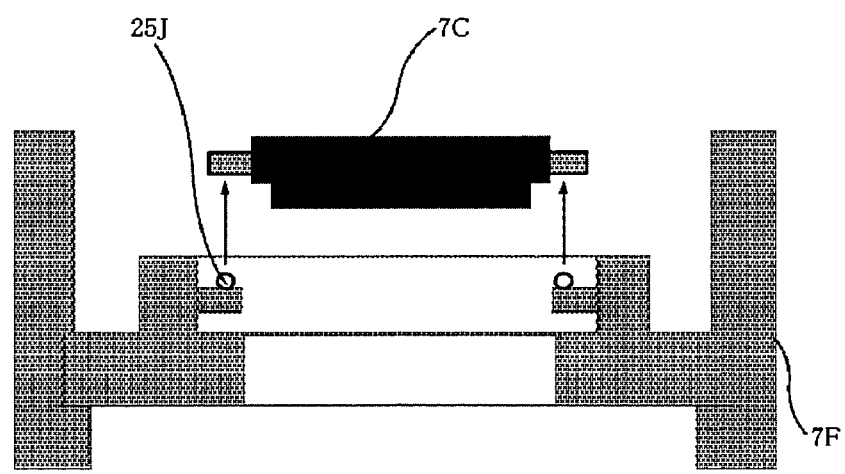
FIG. 9

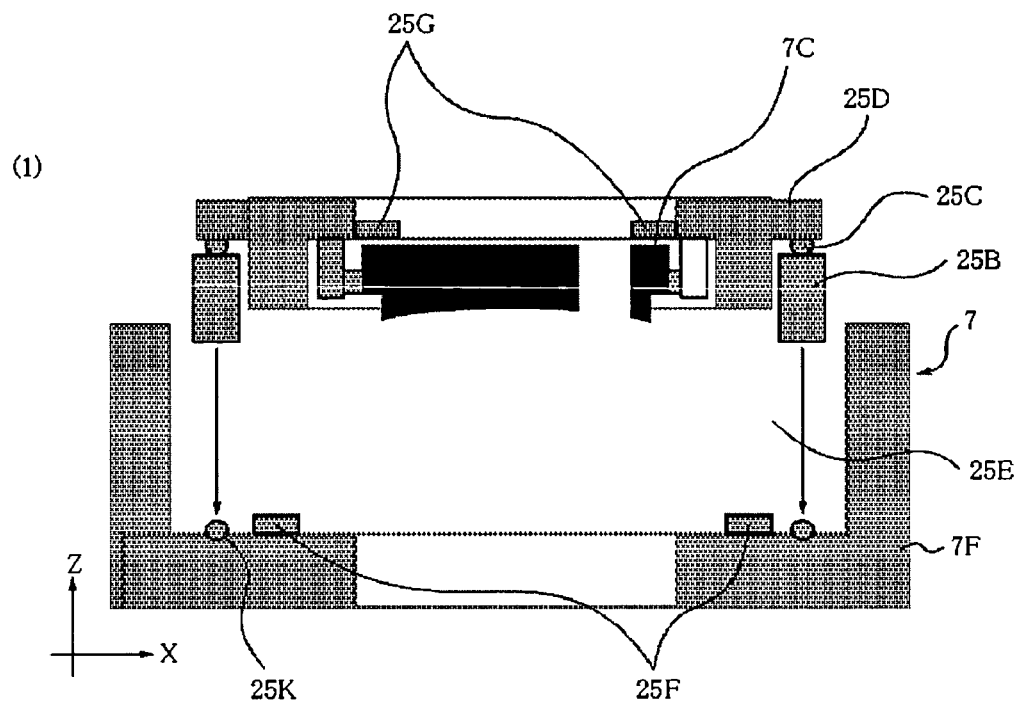
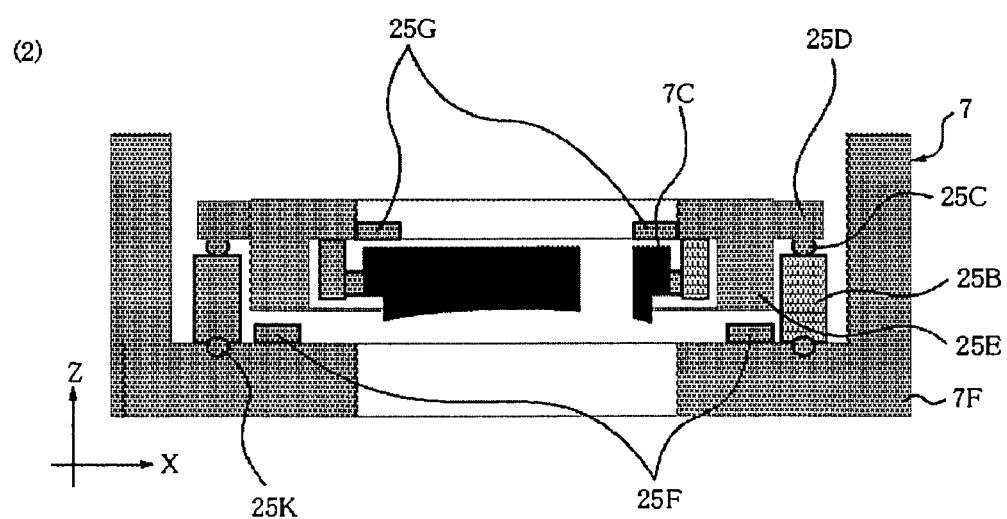
FIG. 10

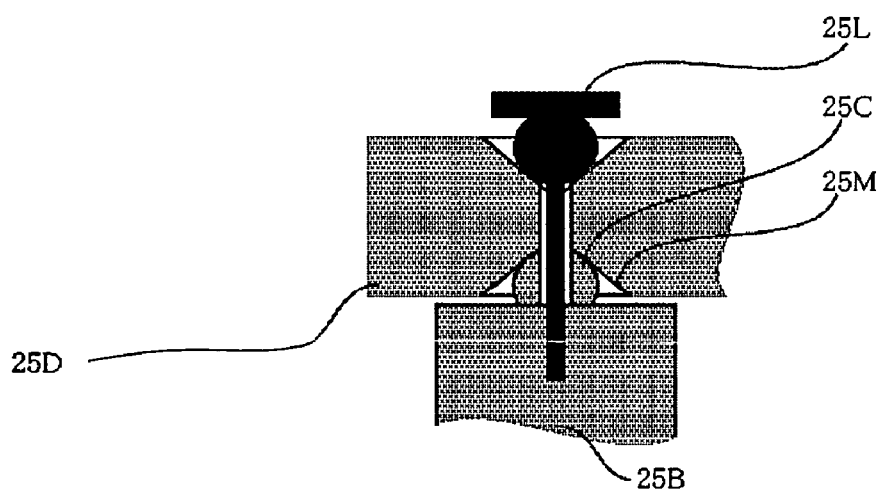
FIGURE VIEWED FROM ARROW A
(1)
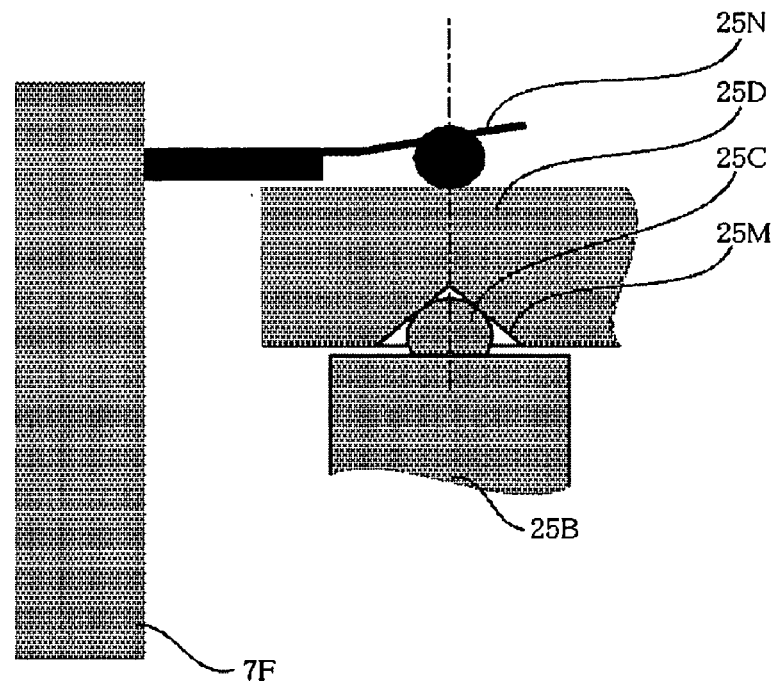
FIGURE VIEWED FROM ARROW A
(2)
FIG. 11

PRIOR ART

PRIOR ART

EXPOSURE APPARATUS AND DEVICE FABRICATION METHOD

This application claims a benefit of priority based on Japanese Patent Application No. 2003-116911, filed on Apr. 22, 2003, which is hereby incorporated by reference herein in its entirety as if fully set forth herein.

BACKGROUND OF THE INVENTION

The present invention relates to an exposure apparatus used for a semiconductor manufacturing process, and a projection exposure apparatus that projects and transfers a reticle pattern onto a silicon wafer. The present invention is suitable for an extreme ultraviolet ("EUV") exposure apparatus that uses EUV light with a wavelength of about 13 to 14 nm as exposure light and a mirror optical system for projection exposure in vacuum.

A prior art example will be described with reference to FIGS. 12 and 13. 101 uses a YAG solid laser etc., serving as an excitation laser for exciting gasified, liquefied or atomized-gasified light-source material atoms into plasma for light emissions by irradiating a laser beam onto the (light-source emission) point on the material.

102 is a light-source emitting part that maintains an internal vacuum. A light source A (or 102A) is an actual emitting point in an exposure light source.

103 is a vacuum chamber that contains an exposure apparatus, and can maintain the vacuum state using a vacuum pump 104.

105 is an exposure light introducing part (or an illumination optical system) for introducing exposure light (or illumination light) from the light-source emitting part 102. The exposure light introducing part 105 includes mirrors A (or 105A) to D (or 105D), makes uniform and shapes the exposure ray, and illuminates a reflective original form (or reticle) 106A, which will be described below.

106 is a reticle stage, and its movable part is mounted with a reflective original form 106A that forms a pattern to be exposed.

107 is a reduction projection mirror optical system that reduces and projects an exposure pattern reflected from the original sequentially form through mirrors A (or 107A) to E (or 107E) onto a wafer 108A at a predefined reduction ratio.

108 is a position-controlled wafer stage for positioning a wafer 108A, as a Si substrate, into a predetermined exposure position so that the wafer stage can be moved along six axes directions, i.e., moved in XYZ directions, tilted about the XY axes, and rotated about the Z axis.

109 is a reticle stage support for supporting the reticle stage 105 on an apparatus installation floor. 110 is a projection optical system body for supporting the reduction projection mirror optical system 107 on the apparatus installation floor. 111 is a wafer stage support for supporting the wafer stage 108 on the apparatus installation floor.

The reticle stage 105, the reduction projection mirror optical system 107, and the wafer stage 108 are supported by the reticle stage support 109, the projection optical system body 110 and the wafer stage support 111, respectively. These include means (not shown) for measuring relative positions so as to continuously maintain their predetermined configuration.

A mount (not shown) for violation isolation from the apparatus installation floor is provided on the reticle stage support 109, the projection system body 110, and the wafer stage 111.

112 is a reticle stocker that includes a storage container that temporarily stores, in an airtight condition, plural original forms supplied from the outside to the inside of the exposure apparatus and suitable for different exposure conditions and patterns.

113 is a reticle changer for selecting and feeding a reticle out of the reticle stocker 112.

114 is a reticle alignment unit that includes a rotary hand that can travel along the XYZ axis directions and can rotate about the Z axis. The reticle alignment unit 114 receives the original form 106A from the reticle changer 113, rotates it by 180°, and feeds it to a reticle alignment scope 115 provided at the end of the reticle stage 106 for fine movements of the original form 106A rotating about the XYZ-axes and aligns the original form 106A with an alignment mark 115A provided on the reduction projection mirror optical system 107. The aligned original form 106A is chucked on the reticle stage 106.

116 is a wafer stocker that includes a storage container for temporarily storing plural wafers 108A from the outside to the inside of the apparatus. 117 is a wafer feed robot for selecting a wafer 108A to be exposed, from the wafer stocker 116, and feeds it to a wafer mechanical pre-alignment temperature controller 118 that roughly adjusts feeding of the wafer in the rotational direction and controls the wafer temperature within controlled temperature in the exposure apparatus.

119 is a wafer feed hand that feeds the wafer 108A that has been aligned and temperature-controlled by the wafer mechanical pre-alignment temperature controller 118 to the wafer stage 108.

120 and 121 are gate valves.as mechanisms for opening and closing a gate for supplying the reticle and wafer from the outside of the apparatus. 122 is also a gate valve that uses a diaphragm to separate spaces among the wafer stocker 116, the wafer mechanical pre-alignment temperature controller 118, and the exposure in the apparatus. The gate valve 122 opens and closes only when feeding the wafer 108A in and out of the apparatus.

Such a separation using the diaphragm can minimize a capacity to be temporarily released to the air when the wafer 108A is fed in from the outside of and fed out of the apparatus, and quickly form a vacuum equilibrium state.

However, when the conventionally structured exposure apparatus positions and fixes the mirrors A (or 107A) to E (107E) relative to the mirror barrel 107F as shown in FIG. 13, carbon, such as the trace of CxHy (hydrocarbon), adheres to and clouds up a surface of the mirror.

When the mirror surface is clouded up, the mirror's reflectance to the EUV light disadvantageously lowers and becomes non-uniform according to (light-reflecting) locations on the mirrors.

When this problem occurs in the illumination optical system in the exposure apparatus, the exposure apparatus suffers from significant problems: The light for illuminating the reticle has lowered intensity or cannot illuminate the reticle uniformly (or has the non-uniform intensity).

When this problem occurs in the illumination optical system in the exposure apparatus, the exposure dose that reaches the wafer lowers, resulting in a long exposure time and lowered throughput. When hydrocarbon and the like adhere to the mirror surface, the mirror's surface shape changes and the imaging performance of the projection optical system deteriorates.

Thus, when hydrocarbon and the like adhere to the mirror surface, the mirror should be exchanged. However, it is not easy to exchange the mirror in the conventional exposure apparatus.

BRIEF SUMMARY OF THE INVENTION

A support apparatus of one aspect according to the present invention includes an optical element, a first support member that supports said optical element, and a second support member that contacts said optical element or said first support member and positions said optical element, wherein said optical element is removably attached to said second support member, or said optical element and said first support member are removably attached to said second support member.

An exposure apparatus of another aspect according to the present invention for introducing light from a light source to an object to be exposed includes an optical element, a first support member that supports said optical element, and a second support member that contacts said optical element or said first support member and positions said optical element, wherein said optical element is removably attached to said second support member, or said optical element and said first support member are removably attached to said second support member.

An exposure apparatus of still another aspect according to the present invention includes at least one optical element, and a positioner for positioning said at least one optical element, wherein said at least one optical element is detachable from and attached to said positioner.

A device fabrication method comprising the steps of exposing a plate using the above exposure apparatus, and developing the plate that has been exposed.

BRIEF DESCRIPTION OF THE DRAWINGS

FIG. 2 is a detailed view of mirrors and a support mechanism in a projection optical system of the first embodiment.

FIG. 4 is a view for explaining mirror measurement means in the projection optical system of the first embodiment.

FIG. 7 is a detailed view of mirror insertion/ejection positioning of the first embodiment.

FIG. 8 is a detailed view of mirror insertion/ejection positioning of a second embodiment.

FIG. 9 is a detailed view of mirror insertion/ejection positioning of a third embodiment.

FIG. 10 is a detailed view of mirror insertion/ejection positioning of a fourth embodiment.

FIG. 11 is a detailed view of mirror insertion/ejection positioning of a fifth embodiment.

DETAILED DESCRIPTION OF THE PREFERRED EMBODIMENTS

A description will be given of embodiments according to the present invention with reference to FIGS. 1 to 11.

First Embodiment

Figure 1:
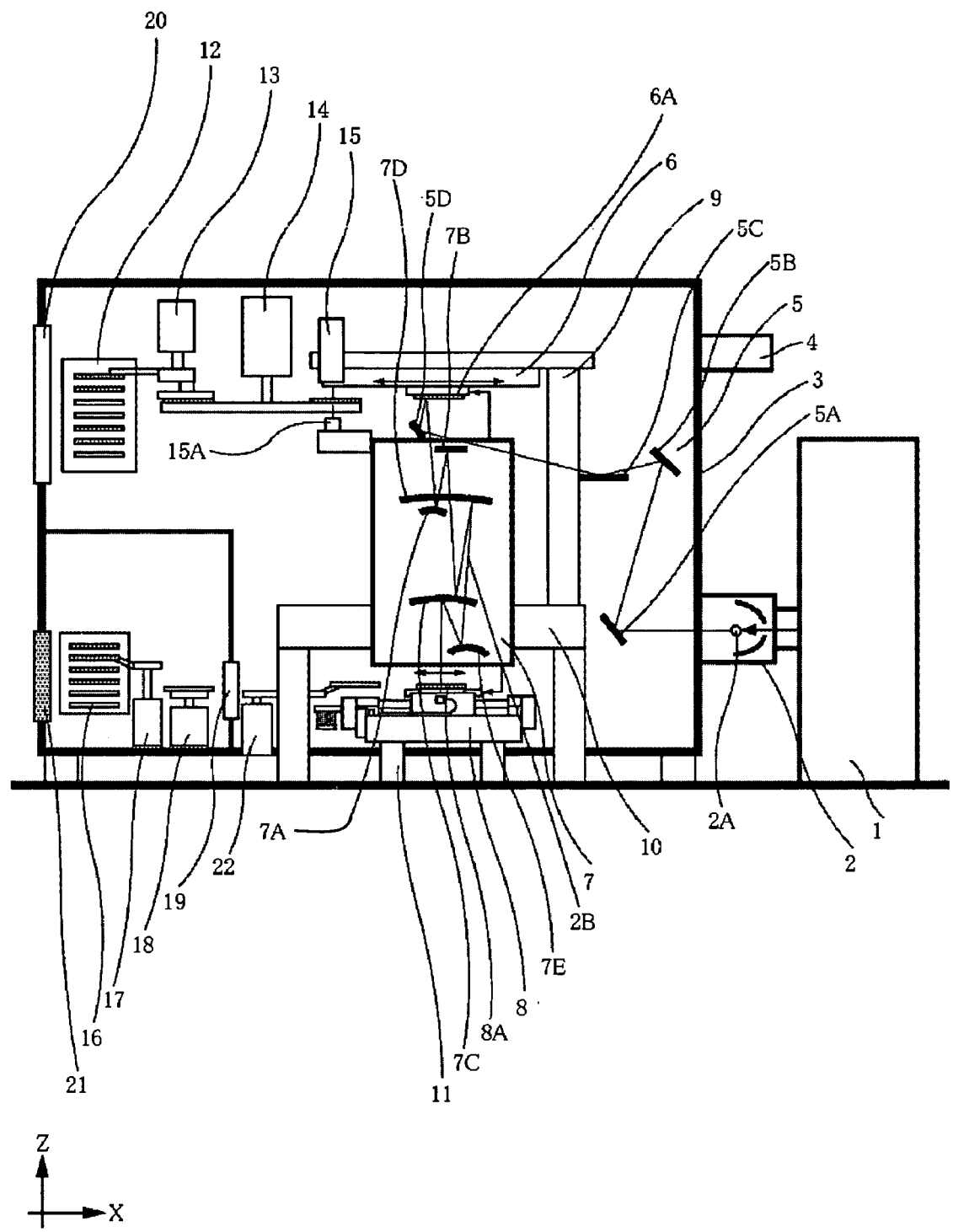
FIG. 1 is an overview of an exposure apparatus of a first embodiment.

A description of a first embodiment will be given with reference to FIG. 1. In FIG. 1, 1 uses a YAG solid laser etc. serving as an excitation laser for exciting gasified, liquefied or atomized-gasified light-source material atoms into plasma for light emissions by irradiating a laser beam onto the (light-source emission) point on the material.

2 is a light-source emitting part that maintains an internal vacuum. A light source A (or 102A) is an actual emitting point in an exposure light source.

3 is a vacuum chamber that contains an exposure apparatus, and can maintain the vacuum state using a vacuum pump 4.

5 is an exposure light introducing part (or an illumination optical system) for introducing exposure light (or illumination light) from the light-source emitting part 2. The exposure light introducing part 5 includes mirrors A (or 5A) to D (or 5D), makes uniform and shapes the exposure ray, and illuminates a predetermined illumination area, which is a slit-shaped illumination area in case of a scanning exposure apparatus, on a reflective original form (or reticle) 6A.

6 is a reticle stage, and its movable part is mounted with a reflective original form 6A that forms a pattern to be exposed.

7 is a reduction projection mirror optical system (or a projection optical system) that reduces and projects an exposure pattern reflected from the original form 6A through mirrors A (or 7A) to E (or 7E) sequentially onto a wafer 8A at a predefined reduction ratio. 7F is a mirror barrel that holds the mirrors A to E. While the first embodiment makes the reduction projection mirror optical system of five mirrors, the number of mirrors may be arbitrary as long as it is plural but preferably it is six, seven or eight. The mirror C in the first embodiment reflects the light from the original form twice on its front and rear surfaces, this structure is for exemplary purposes only as long as each mirror reflects the light from the original form once or more. Of course, a mirror that reflects the light from the original form twice or more may be provided for the reduced number of mirrors.

8 is a position-controlled wafer stage for positioning a wafer 8A as a Si substrate onto a predetermined exposure position so that the wafer stage can be moved in six axes directions, i.e., moved along the XYZ directions, tilted about the XY axes, and rotated about the Z axis.

9 is a reticle stage support for supporting the reticle stage 6 on an apparatus installation floor. 10 is a projection optical system body for supporting the reduction projection mirror optical system 7 on the apparatus installation floor. 11 is a wafer stage support for supporting the wafer stage 8 on the apparatus installation floor.

The reticle stage, the reduction projection mirror optical system, and the wafer stage are supported by the reticle stage support 9, the projection optical system body 10 and the wafer stage support 11, respectively. These include means (not shown) for measuring relative positions so as to continuously maintain their predetermined configuration.

A mount (not shown) for violation isolation from the apparatus installation floor is provided on the reticle stage support, the projection system body, and the wafer stage.

12 is a reticle stocker that includes a storage container that temporarily stores, in an airtight condition, plural original forms as reticles supplied from the outside to the inside of the apparatus and suitable for different exposure conditions (such as an illumination condition) and patterns (such as a pattern width and an aspect ratio).

13 is a reticle changer for selecting and feeding a reticle out of the reticle stocker 12.

14 is a reticle alignment unit that includes a rotary hand that can travel along the XYZ directions and can rotate about the Z axis. The reticle alignment unit 14 receives the original form 6A from the reticle changer 13, rotates it by 180°, and feeds it to a reticle alignment scope 15 provided at the end of the reticle stage 6 for fine movements of the original form 6A rotating about the XYZ-axes and aligns the original form 6A with an alignment mark 15A provided on the reduction projection mirror optical system 7. The aligned original form 6A is chucked on the reticle stage 6.

16 is a wafer stocker that includes a storage container for temporarily storing plural wafers from the outside to the inside of the apparatus.

17 is a wafer feed robot for selecting a wafer 8A to be exposed, from the wafer stocker 16, and feeds it to a wafer mechanical pre-alignment temperature controller 18 that roughly adjusts feeding of the wafer in the rotational direction and controls the wafer temperature within controlled temperature in the exposure apparatus.

19 is a wafer feed hand that feeds the wafer 8A that has been aligned and temperature-controlled by the wafer mechanical pre-alignment temperature controller 18 to the wafer stage 8.

20 and 21 are gate valves as a mechanism for opening and closing a gate for supplying the reticle and wafer from the outside of the apparatus.

22 is also a gate valve that uses. a diaphragm to separate the wafer stocker 16, a space of the wafer mechanical pre-alignment temperature controller 18, and an exposure space from each other in the apparatus, and opens and closes only when feeding the wafer 8A in and out of the apparatus. Such a separation using the diaphragm can minimize a capacity to be temporarily released to the air when the wafer 8A is fed in from the outside of and fed out of the apparatus, and quickly form a vacuum equilibrium state.

This configuration of the instant embodiment enables a mirror to be exchanged when its surface is clouded up, and solves problems in the illumination and projection optical systems. A description will now be given of a method of. exchanging a mirror, a method of positioning the mirror and a method of fixing the mirror, which improve problems of deteriorated imaging performance and lowered light intensity of the projection optical system, and lowered and non-uniform light intensity of the illumination optical system.

The following description exemplarily uses mirrors C (or 7C) and E (or 7E) in the reduction projection mirror optical system 7 shown in FIG. 2.

The mirror 7C is held by and minutely movable relative to a mirror holding element 25D via a fine-movement drive means 25E. The mirror holding element is supported by the mirror barrel 7F via the element positioning member 25C and rough-movement drive means 25B. The mirror holding element 25D is roughly movable relative to the mirror barrel 7F, and therefore the mirror C is held movable both minutely and roughly. The rough-movement and fine-movement drive means have different minimum units of a driving amount, and different drivable strokes. More specifically, the minimum unit of the driving amount of the rough-movement drive means is larger than that of the fine-movement drive means. Preferably, the minimum unit of the driving amount of the rough-movement drive means is larger than double or more preferably decuple of that of the fine-movement drive means. Moreover, the stroke of the rough-movement drive means (or a drivable distance) is longer than that of the fine-movement drive means. Preferably, the stroke of the rough-movement drive means (or a drivable distance) is longer than double or more preferably decuple that of the fine-movement drive means.

There are plural mirror rough-movement displacement measuring means for measuring a mirror position from the mirror barrel 7F between the mirror barrel and the mirror holding element 25D, for measuring a displacement of the mirror holding element 25D driven by the rough-movement drive means 25B. Position measuring means provided on other components in the exposure apparatus may measure the positions of the mirror barrel 7F and the mirror holding element 25D. Alternatively, position measuring means provided on a predetermined (preferably fixed) member outside the exposure apparatus may be used.

In addition, there are plural mirror fine-movement displacement measuring means 25G between the mirror holding element 25D and the mirror C (or 7C), for measuring displacements of the mirror C driven by the fine-movement drive means 25E, relative to the mirror holding element. Position measuring means provided on other components in the exposure apparatus may measure the positions of the mirror barrel 7F and the mirror holding element. Alternatively, position measuring means provided on a predetermined (preferably fixed) member outside the exposure apparatus may be used.

A similar structure is provided for the mirror E (or 7E), like the mirror C: The positions of the mirror holding element 26D relative to the mirror barrel 7F are measured by plural mirror rough-movement displacement measuring means 26F. The position of the mirror E relative to the mirror holding element 26D is measured by plural mirror fine-movement displacement measuring means 26G. Similar to the mirror C, the positions of the mirror barrel 7F, mirror holding element 26D and mirror E may be measured using the position measuring means provided on the other member in the exposure apparatus.

The position measuring means that can measure positions of the mirror holding element and the mirror holding element relative to the mirror barrel 7F provides origins of the mirror rough-movement drive means and fine-movement drive means. By this origin setting, the measurements of the positions among mirrors relative to the mirror barrel are available.

In addition to measurements of the positions among mirrors relative to the mirror barrel, measuring means, such as a laser interferometer, is provided to precisely measure a mirror position, so as to reduce the reflective surface precision of each mirror down to target surface precision (which is 0.1 to 0.2 nm in the mirrors in the projection optical system and 1 nm to several nm in the mirrors in the illumination optical system).

A description will now be given of the measurement method using a laser interferometer.

Figure 3:
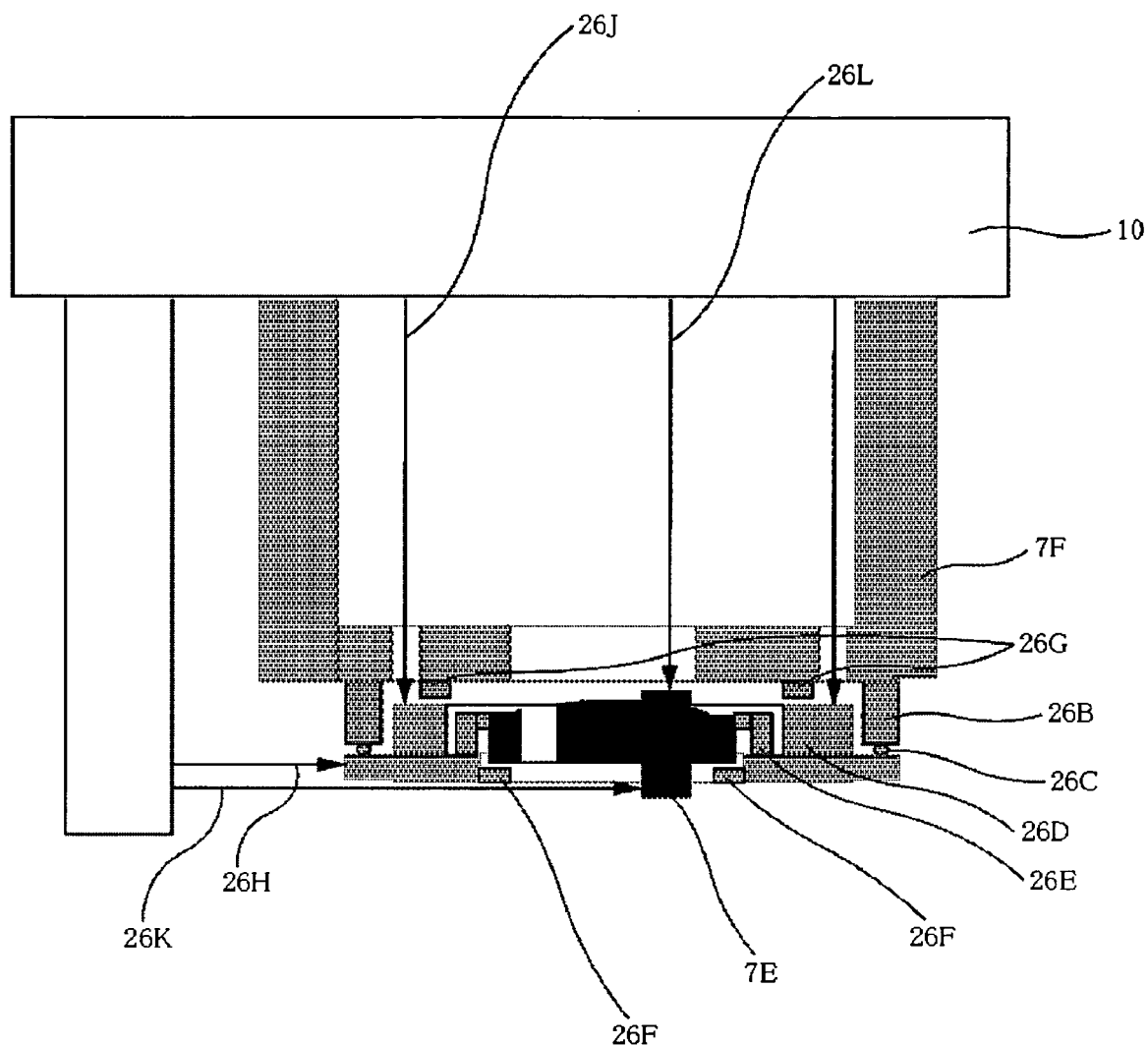
FIG. 3 is a detailed view of mirrors in a projection optical system of the first embodiment.

A description will be given of the laser interferometry at a mirror position with reference to FIGS. 3 and 4, using the mirror E as an example. As shown in FIG. 3, the mirror E includes a measurement reflective surface, and respective mirror positions and relative positions from the projection optical system body 10 are measured.

In order to the XY measurements for the mirror holding element 26D, the measurement light of the mirror displacement measuring means 26H by the laser interferometer, etc. is irradiated onto the reflective surface provided on the mirror holding element 26D, and the mirror's displacement is measured by the laser Doppler displacement measurement method, etc.

Similarly, the mirror displacement measuring means 26J measures a displacement in the Z direction of the mirror holding element 26D. In addition, the measurement light of the laser interferometer is irradiated onto the reflective surface provided on (or integrated with) the mirror'from the mirror displacement measuring means 26K and mirror displacement measuring means 26L for XYZ measurements of the mirror E, and the XYZ displacement changes of the mirror is measured by the laser Doppler displacement measurement method, etc.

The above measuring means sets an origin for the mirror E relative to the mirror barrel 7F, and drives the mirror E to the geometrical design center position. The optical-axis adjustment and aberrational corrections for the total reflection mirror in the projection optical system are conducted at the geometrical design center position.

The displacement measuring means that can provide precise measurements of displacement, such as a laser interferometer, is used for the displacement measuring means for measuring displacements among and relative positions of respective mirrors relative to the projection optical system body 10. Thereby, the mirror is driven so that the aberration of the projection optical system becomes equal to or lower than a target value (i.e., to reduce the aberration lower than the target value) using the aberrational target value as an origin in the entire projection optical system.

Figure 5:
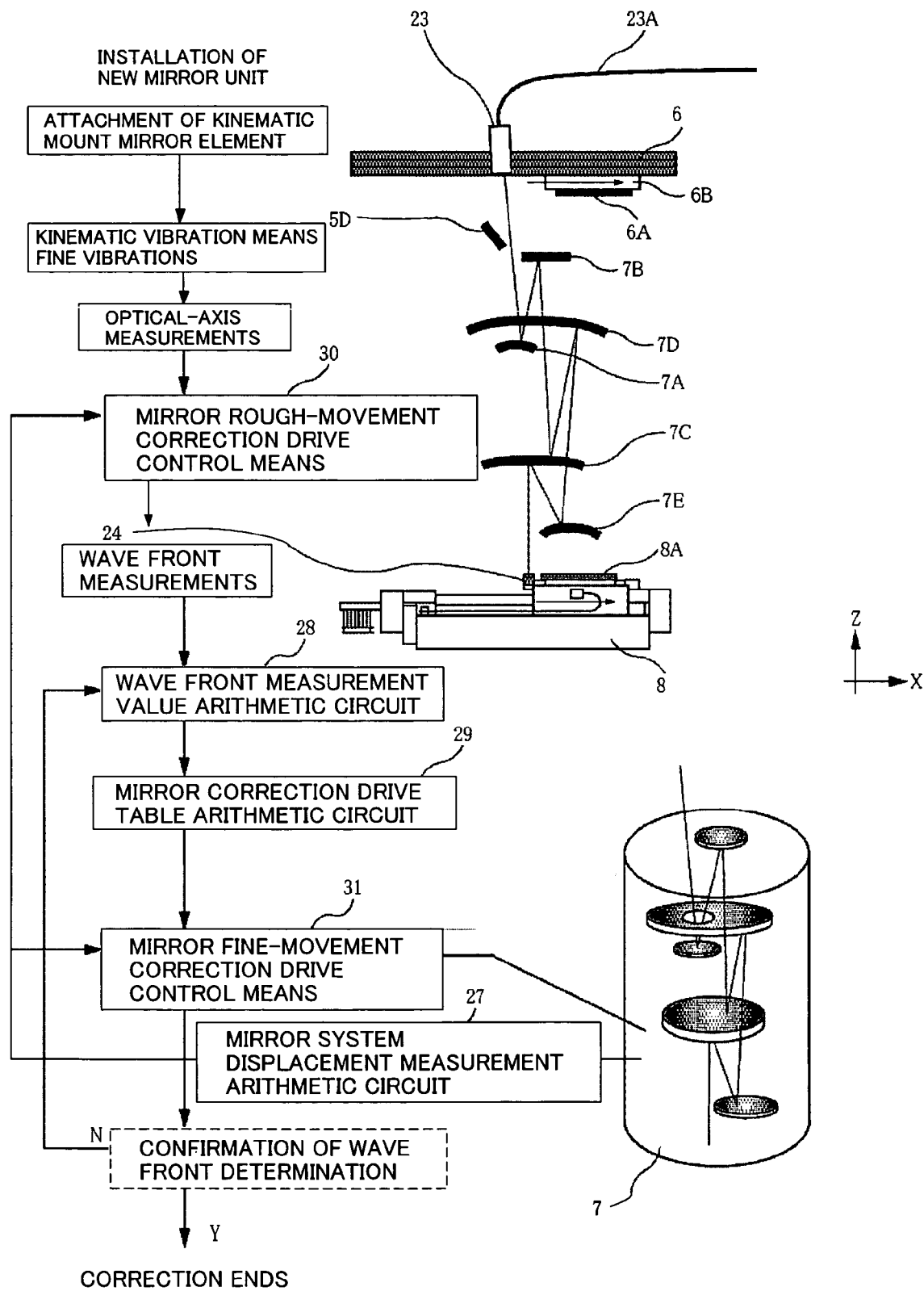
FIG. 5 is a structural view of mirror positioning and wave front measurement means of the first embodiment.

A description will now be given of the measurement method of an aberrational target value through total reflection mirrors in the projection optical system. While the reticle stage slider 6B of the reticle stage 6 retracts, as shown in FIG. 5, the measurement light emitted from a measurement light source supply fiber 23A for a wave front measuring unit is emitted, as illustrated, from the measurement light source emission opening 23. The measurement light is reflected on the entire reflective surface on the mirror in the projection optical system, and received by the wave front measurement light-receiving sensor 24 installed on the wafer stage movable part 8 to measure the wave front aberration in the projection optical system on the mirror's entire reflective surface based on the detection result, as illustrated.

Next, a wave front measurement value is calculated based on the measurement result by the wave front measurement light-receiving sensor 24. A mirror correction drive table arithmetic circuit 29 calculates corrective drive directions, drive amounts and applied power amounts of the mirrors A (or 7A) to E (or 7E) based on the calculated wave front measurement values, and transmits them as target values to the mirror fine-movement correction drive means 30 or the mirror rough-movement drive means.

Simultaneously, the mirror system displacement measurement arithmetic circuit 27 collects signals that reflect position information of the mirrors A (or 7A) to E (or 7E) from the mirror displacement measuring means, such as 26F and 26G, and the mirror displacement measuring means (laser interferometers) such as 26H, 26J, 26K and 26L, measure the mirror positions from the mirror barrel and the projection optical system and the relative positions among the mirrors.

After the fine-movement drive means 26E and rough-movement drive means 26B drive each mirror to a target position, the wave front measurement is confirmed again. When the wave front aberration meets the predefined value or when the aberration is lower than the target value, the correction ends. When the wave front aberration does not meet the specification or when the aberration is greater than the target value, the wave front measurement arithmetic circuit calculates the residual wave front aberration amount again, and the above correction is repeated to reduce the aberration in the projection optical system down to or smaller than the target specification.

The target wave front aberration amount is one generated in the apparatus when the projection optical system solely adjusts a mirror position initially, and reduces the aberration below the appropriate target amount. A position and shape of each mirror at this time are origins of the mirror position and mirror shape. Of course, the target wave front aberration amount may be set by another means. With respect to the origin of the mirror position, it is possible to reduce the aberration down to or smaller than the target value by driving the mirror using the rough-movement and fine-movement drive means.

Figure 6:
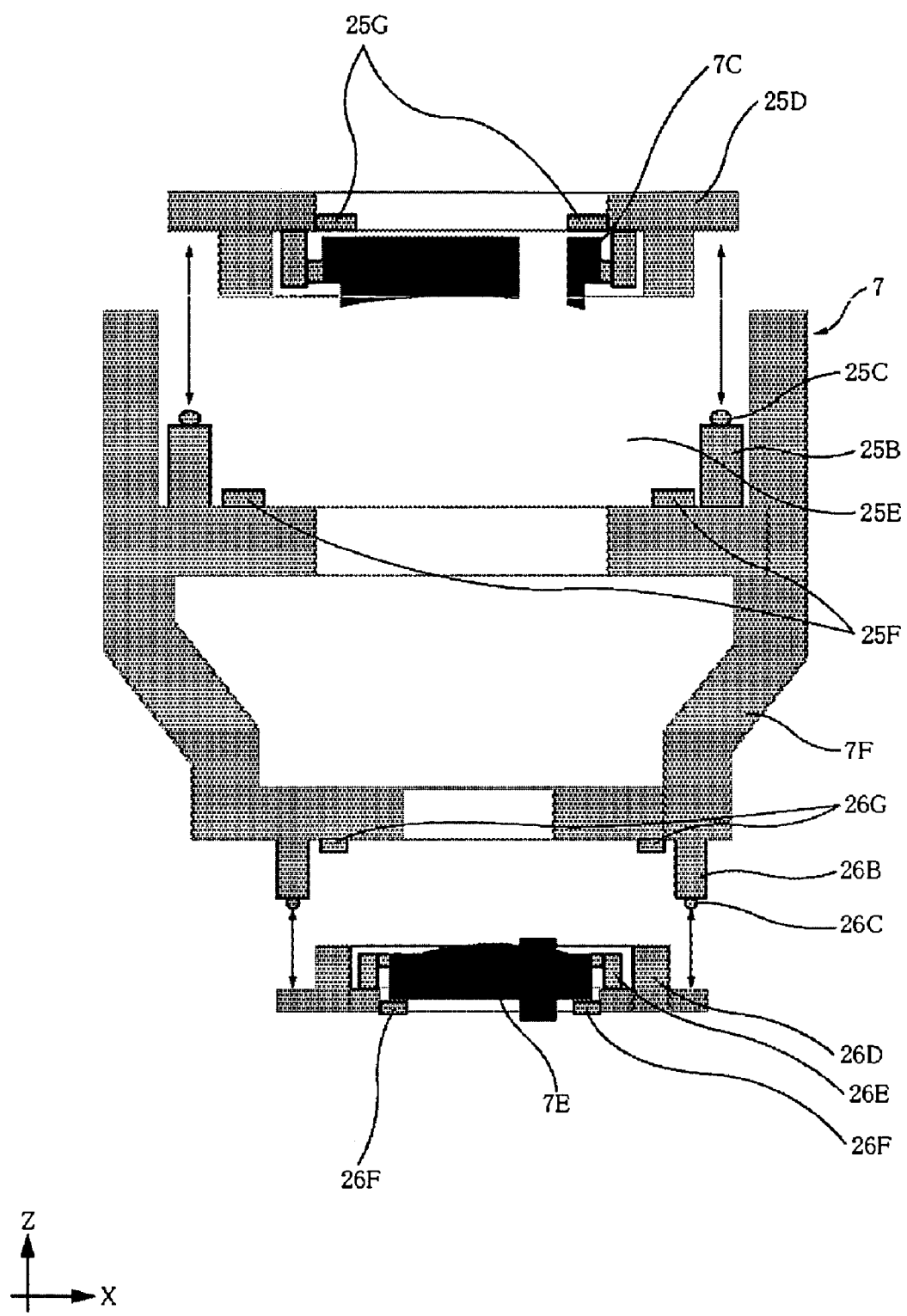
FIG. 6 is a detailed view of mirror insertion/ejection positioning of the first embodiment.
Figure 12:
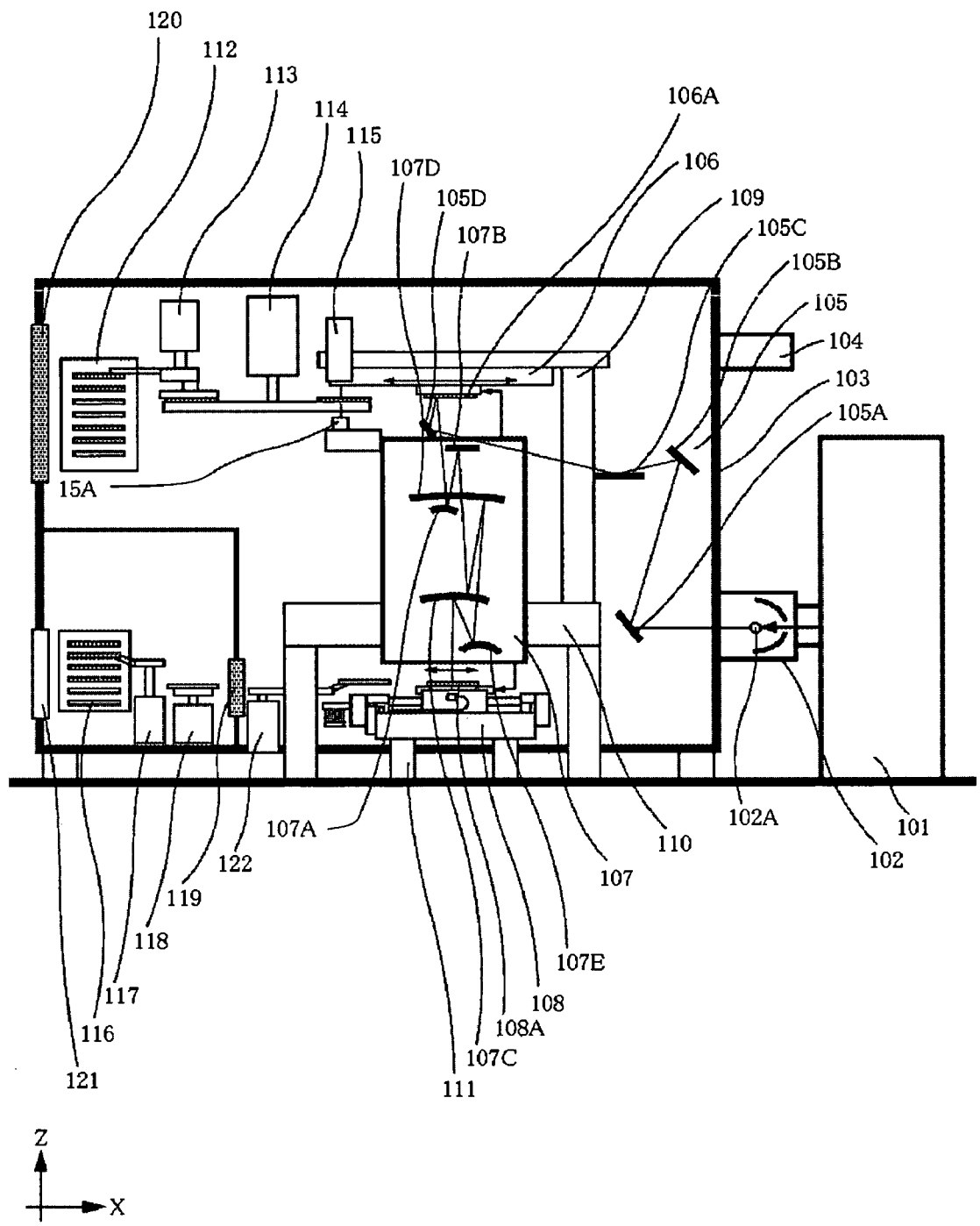
FIG. 12 is an overview of a conventional exposure apparatus.
Figure 13:
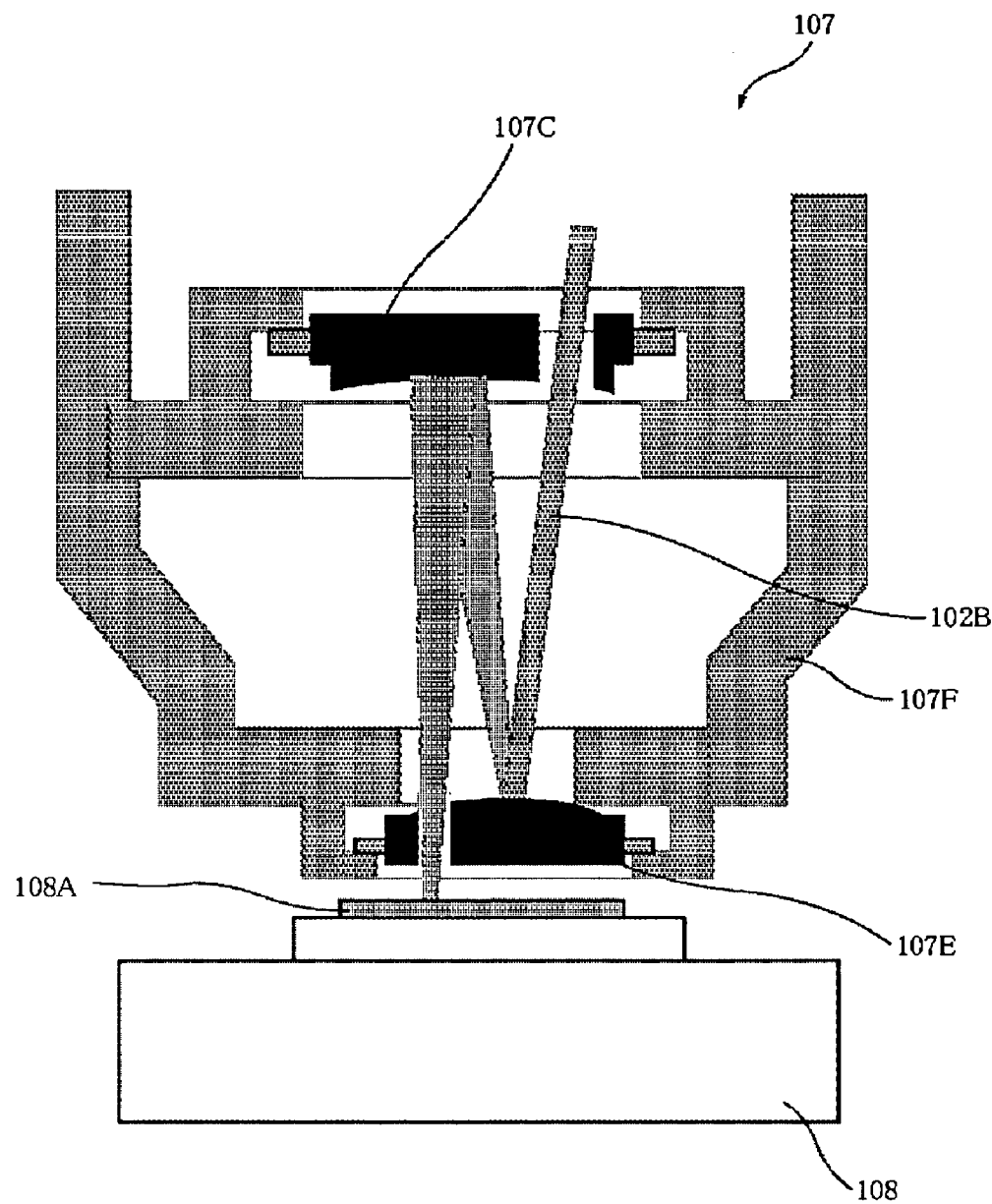
FIG. 13 is a structural view of mirrors in a conventional projection optical system.

As shown in FIGS. 2 and 6, the instant embodiment provides the rough-movement drive means 25B integral with the mirror barrel, holds and positions the mirror holding element relative to the mirror barrel, by providing, on a circumference of the mirror holding element at regular intervals, three pairs of the element positioning member 25C integrated with the rough-movement drive means, and the kinematic mount 25M provided on the mirror holding element (which is formed as three V-shaped grooves radially provided in three directions). The V-shaped groove may be provided on the rough-movement drive means, and the element positioning member may be integrated with the mirror holding element. The element positioning member may be arranged between the rough-movement drive means and the mirror barrel.

This structure enables the mirror, the fine-movement drive means and the mirror holding element to be simultaneously separated from the mirror barrel when the mirror is clouded up in the catoptric projection optical system in the exposure apparatus. In addition, this structure advantageously facilitates re-positioning of the mirror, the fine-movement drive means and the mirror holding element relative to the mirror barrel by bringing the kinematic mount into contact with the element positioning member. Thus, when two members (e.g., the mirror barrel and three members including the mirror, the fine-movement drive means and the mirror holding element in this case) contact each other through the kinematic mount, this kinematic mount maintains a positional relationship between them. Therefore, the fine-movement drive means does not have to be provided particularly, and the mirror and the mirror holding element (and the element positioning member) may be made detachable from and attachable to the mirror barrel. Of course, this structure is applicable to other mirrors in the exposure apparatus.

Suppose that the mirror holding element is attached to the kinematic mount in positioning the mirror, as shown in FIGS. 5 and 7, (or when the mirror is attached to the mirror barrel). The rough-movement drive means 25B is used to apply such high-frequency fine vibrations as about several microns in amplitude to the element positioning member 25C, and thus the friction coefficient at a contact part between the kinematic mount 25M and the element positioning member 25C turns to the kinetic friction area, different from the static friction area, facilitating relative movements between the kinematic mount part and the element positioning member in the positioning time. Of course, the fine-movement drive means may be used to vibrate the mirror holding element so that the vibration.

The kinematic mount part may be provided between the mirror and the mirror holding element to enable the mirror attached and detached at the kinematic mount part.

While the present invention uses the mirror holding element, the mirror barrel may directly support the mirror. In this case, it is preferable that the mirror is positioned relative to the mirror barrel by supporting the mirror on the mirror barrel using the kinematic mount. In this case, the vibrating means is preferably provided (on a side surface of the mirror barrel) near the kinematic mount of the mirror barrel.

Second Embodiment

A description will be given of a second embodiment with reference to FIG. 8. While the first embodiment uses the high-frequency fine vibrating means as rough-movement drive means for driving a mirror, the second embodiment provides mirror vibrating means 25H at a side surface of the mirror barrel 7F, as shown in FIG. 8. As shown in FIG. 8(1), the mirror C is positioned at an element positioning member 25C via the mirror holding element 25D. Then, the mirror vibrating means 25H is brought into contact with the mirror holding element 25D, as shown in FIG. 8(2), to propagate vibrations generated by the mirror vibrating means to the mirror holding element. Thereby, high-frequency fine vibrations are applied between the element positioning member 25C and a kinematic positioning surface of the mirror holding element 25D, to quickly and precisely positioning the mirror holding element 25D.

Third Embodiment

A description will be given of a third embodiment with reference to FIG. 9. While the first and second embodiments correct the optical axis to a target position and reduce aberration, thereby exchanging a mirror by driving the mirror using the rough-movement mirror drive means, the third embodiment is different from these first and second embodiments in that there is no correction system of the optical axis and aberration.

The mirror C is directly positioned via the positioning part 25J as a kinematic mount relative to the mirror barrel 7F. This structure enables the mirror to be detached from and attached to the mirror barrel through the kinematic mount part. The third embodiment may add vibrating means.

This embodiment may provide an optical element with a V-shaped groove or convex part (at a portion corresponding to the element positioning member).

Fourth Embodiment

A description will be given of a third embodiment with reference to FIG. 10. While the first and second embodiments provide a detachment and an attachment via the mirror holding element 25D, a structure of the fourth embodiment provides a detachment and an attachment between the rough-movement drive means 25B and the mirror barrel 7F, and easy positioning, by applying kinematic support between the rough-movement drive means and the mirror barrel.

This structure enables an integral replacement of components from the rough-movement drive means 25B to the mirror C, and facilitates various components'replacements.

Fifth Embodiment

The first to fourth embodiments do not address a method of fixing a positioned mirror, although they uses a kinematic mount for a detachment and an attachment of the mirror.

The fifth embodiment positions an element positioning member 25C to a kinematic mount 25M, as shown in FIG. 11(1), and uses the element fixing member 25L to fasten and fix the rough-movement drive means 25B from the top in fixing the mirror holding element 25D, thereby preventing an offset of a mirror position after the mirror is positioned.

The mirror (or mirror holding element) may be fixed, as shown in FIG. 11(2), by using the element fixing member to compress the mirror holding element 25D from the top or from an opposite side of the rough-movement drive means with respect to the mirror holding element.

Sixth Embodiment

Figure 14:
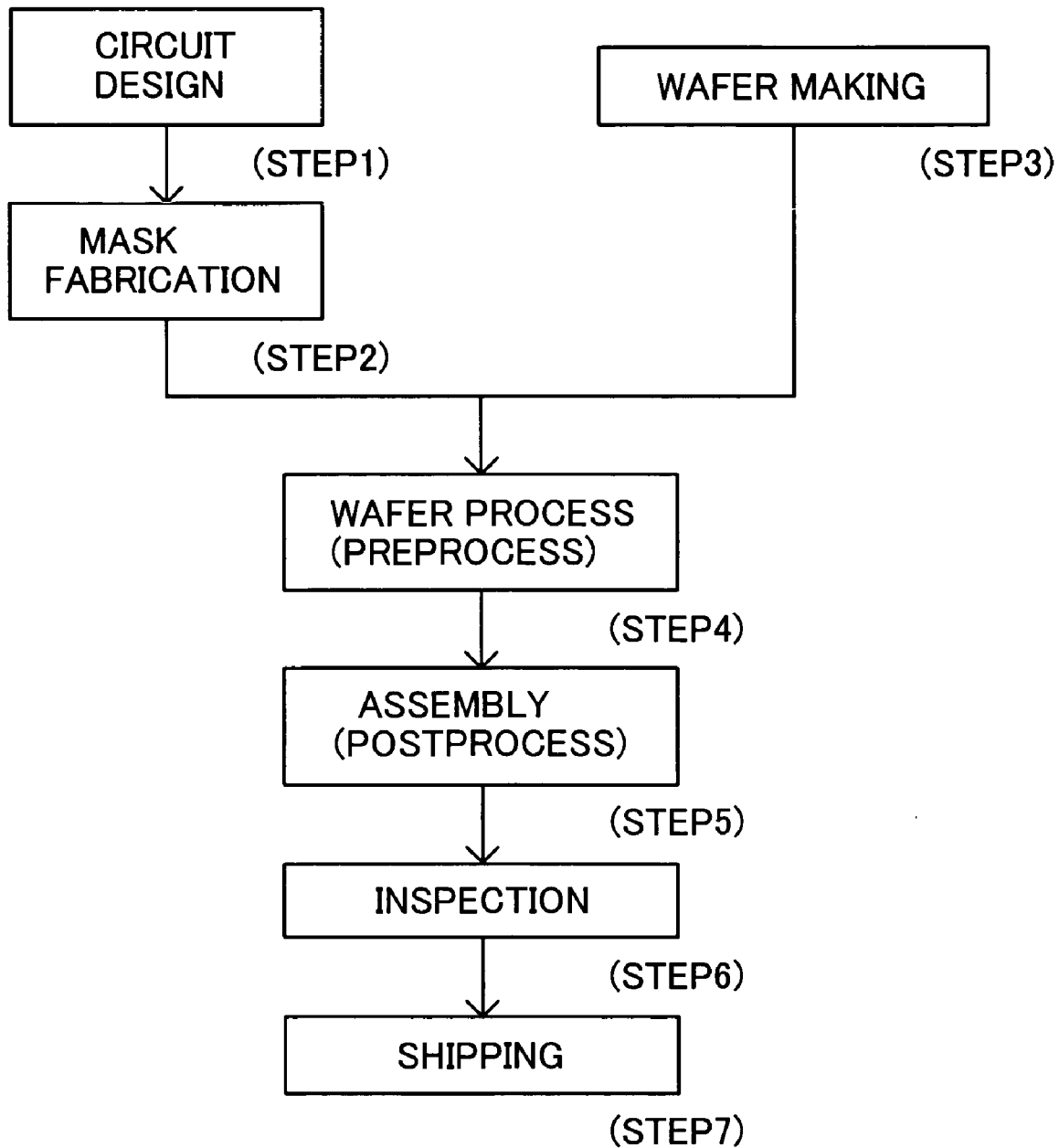
FIG. 14 is a flowchart for explaining a method for fabricating devices (semiconductor chips such as ICs, LSIs, and the like, LCDs, CCDs, etc.).
Figure 15:
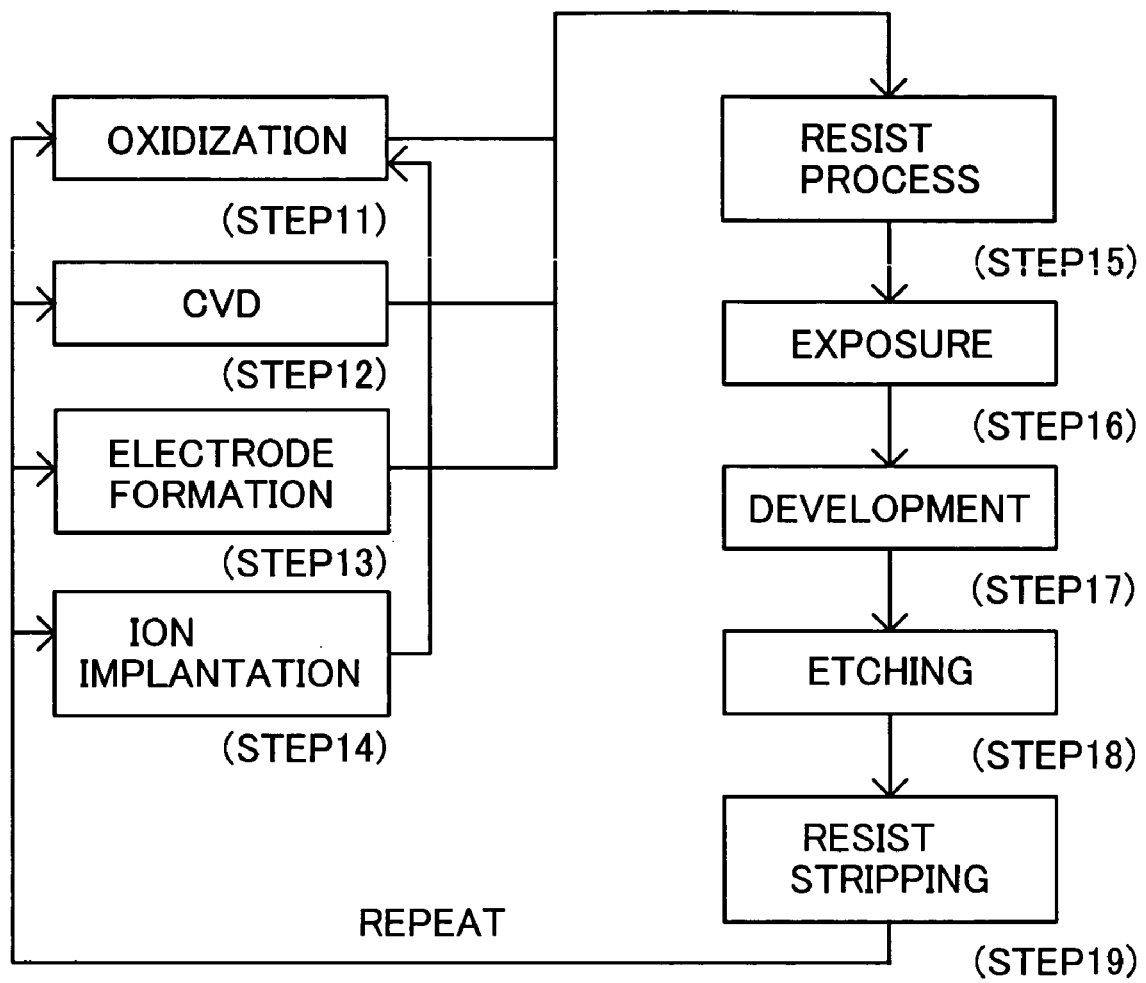
FIG. 15 is a detailed flowchart for Step 4 of wafer process shown in FIG. 12.

Referring to FIGS. 14 and 15, a description will now be given of an embodiment of a device fabricating method using the above exposure apparatus. FIG. 14 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus, and the devices as finished goods also constitute one aspect of the present invention.

Further, the present invention is not limited to these preferred embodiments, and various variations and modifications may be made without departing from the scope of the present invention.

The above first to sixth embodiments may be arbitrarily combined unless it is contradictory.

The optical element support apparatus, exposure apparatus and device fabrication method having structures illustrated in the embodiments can prevent deteriorated optical performance in an optical system and reduce the degree of deterioration, when the optical element is exchanged.

Specifically, when the mirror surface is clouded up, a replacement of the mirror would improve deteriorated optical performance to the wafer and lowered light intensity in the projection optical system. The replacement of the mirror would improve lowered and non-uniform light intensity to the mask in the illumination optical system, and improve deteriorated light intensity, such as insufficient condensing, in the light-source mirror.

The embodiments of the present invention can be expressed as follows:

Embodiment 1

A support apparatus comprising:
an optical element;
a first support member that supports said optical element; and
a second support member that contacts said optical element or said first support member and positions said optical element, wherein said optical element is removably attached to said second support member, or said optical element and said first support member are removably attached to said second support member.

Embodiment 2

A support apparatus according to embodiment 1, wherein said second support member supports said optical element or said first support member that supports said optical element.

Embodiment 3

A support apparatus according to embodiment 1, wherein said second support member contacts said first support member that supports said optical element.

Embodiment 4

A support apparatus according to embodiment 3, further comprising a first vibrator that vibrates said first support member.

Embodiment 5

A support apparatus according to embodiment 3, further comprising a first driver that drives said optical element relative to said first support member.

Embodiment 6

A support apparatus according to embodiment 3, further comprising a second vibrator that vibrates said second support member.

Embodiment 7

A support apparatus according to embodiment 3, further comprising a second driver that drives said optical element or said first support member that supports said optical element relative to said second support member.

Embodiment 8

An exposure apparatus for introducing light from a light source to an object to be exposed, said exposure apparatus comprising:
an optical element;
a first support member that supports said optical element; and
a second support member that contacts said optical element or said first support member and positions said optical element, wherein said optical element is removably attached to said second support member, or said optical element and said first support member are removably attached to said second support member.

Embodiment 9

An exposure apparatus according to embodiment 8, wherein said second support member supports said optical element or said first support member that supports said optical element.

Embodiment 10

An exposure apparatus according to embodiment 8, wherein said second support member contacts said first support member that supports said optical element.

Embodiment 11

An exposure apparatus according to embodiment 10, further comprising a first vibrator that vibrates said first support member.

Embodiment 12

An exposure apparatus according to embodiment 10, further comprising a first driver that drives said optical element relative to said first support member.

Embodiment 13

An exposure apparatus according to embodiment 10, further comprising a second vibrator that vibrates said second support member.

Embodiment 14

An exposure apparatus according to embodiment 10, further comprising a second driver that drives said optical element or said first support member that supports said optical element relative to said second support member.

Embodiment 15

An exposure apparatus according to embodiment 8, further comprising:
an optical system that includes the optical element;
an aberration measurement mechanism for measuring aberration of the optical system; and
a driver for driving said optical element or said first support member that supports said optical element relative to said second support member based on a measurement result of said aberration measurement mechanism.

Embodiment 16

An exposure apparatus according to embodiment 8, further comprising:
- a first driver for driving said optical element relative to said first support member; and
- a second driver for driving said first support member relative to said second support member, wherein a minimum unit of a driving amount by said first driver is smaller than that of said second driver.

Embodiment 17

An exposure apparatus according to embodiment 8, further comprising:
- a first driver for driving said optical element relative to said first support member; and
- a second driver for driving said first support member relative to said second support member, wherein a drivable range of said first driver is narrower than that of said second driver.

Embodiment 18

An exposure apparatus according to embodiment 8, wherein said second support member uses a kinematic mount to support said optical element or said first support member that supports said optical element.

Embodiment 19

A device fabrication method comprising the steps of:
- exposing a plate using an exposure apparatus according to embodiment 8; and
- developing the plate that has been exposed.

Embodiment 20

An exposure apparatus comprising:
- at least one optical element;
- a positioner for positioning said at least one optical element, wherein said at least one optical element is detachable from and attached to said positioner.

Embodiment 21

An exposure apparatus according to embodiment 20, further comprising a first support member for supporting said at least one optical element, and said positioner positions said first support member.

Embodiment 22

An exposure apparatus according to embodiment 20, wherein said first support member uses a kinematic mount to support said at least one optical element.

Embodiment 23

An exposure apparatus according to embodiment 21, wherein said first support member has a convex or groove part, said optical element has a groove or convex part, and is positioned through a contact between the convex or groove part of said first support member and the groove or convex part of said optical element.

Embodiment 24

An exposure apparatus according to embodiment 21, further comprising a first vibrator that vibrates at least one of said at least one optical element and said first support member.

Embodiment 25

An exposure apparatus according to embodiment 21, further comprising a second support member, supported by said first support member, for removably supporting said at least one optical element.

Embodiment 26

An exposure apparatus according to embodiment 21, further comprising a second support member, removably supported by said first support member, for supporting said at least one optical element.

Embodiment 27

An exposure apparatus according to embodiment 25, further comprising a second vibrator for vibrating said second support member.

Embodiment 28

An exposure apparatus according to embodiment 25, further comprising a first driver, provided between said first and second support members, for driving said second support member relative to said first member, said first driver being detachable and attachable between said first driver and said first support member.

Embodiment 29

An exposure apparatus according to embodiment 25, further comprising a first driver, provided between said first and second support members, for driving said second support member relative to said first member, said first driver being detachable and attachable between said first driver and said second support member.

Embodiment 30

An exposure apparatus according to embodiment 25, further comprising a second driver for driving said at least one optical element relative to said second support member.

Embodiment 31

An exposure apparatus according to embodiment 30, wherein said second driver vibrates said positioner.

Embodiment 32

An exposure apparatus according to embodiment 20, further comprising:
- a projection optical system for introducing light from the original form to the plate; and
- a member for measuring aberration of said projection optical system.

Embodiment 33

An exposure apparatus according to embodiment 32, wherein the aberration of said projection optical system is wave front aberration.

Embodiment 34

An exposure apparatus according to embodiment 32, further comprising a member for adjusting a position of said at least one optical element based on a measurement result of said measurement member.

Embodiment 35

An exposure apparatus according to embodiment 20, further comprising a member for measuring an optical axis or a position of said at least one optical element.

Embodiment 36

An exposure apparatus according to embodiment 20, further comprising a member for adjusting a position of said at least one optical element based on a measurement result of said measuring member.

Embodiment 37

A device fabrication method comprising the steps of:
exposing a plate using an exposure apparatus according to embodiment 20; and
developing the plate that has been exposed.

What is claimed is:

1. A support apparatus comprising:
a single optical element;
a first support member that supports said optical element;
an actuator that drives said optical element relative to said first support member;
a second support member that supports said first support member, and
a positioning part that positions said first support member relative to said second support member, wherein said positioning part removably attaches said first support member to said second support member, and said positioning part including a positioning member and a groove formed on one of said first and second support members,
wherein said actuator vibrates at least one of the positioning member and the groove.

2. A support apparatus comprising:
a single optical element;
a first support member that supports said optical element;
a second support member that supports said first support member;
an actuator that drives said first support member relative to said second support member, and
a positioning part that positions said first support member relative to said second support member, wherein said positioning part removably attaches said first support member to said second support member, and said positioning part including a positioning member and a groove formed on one of said first and second support members,
wherein said actuator vibrates at least one of the positioning member and the groove.

3. An exposure apparatus for introducing light from a light source to an object to be exposed, said exposure apparatus comprising:
a plurality of optical elements;
a first support member that supports one of said optical elements;
a first actuator that drives said one of optical elements relative to said first support member;
a second support member that supports said first support member, and
a positioning part that positions said first support member relative to said second support member, wherein said positioning part removably attaches said first support member to said second support member, and said positioning part including a positioning member and a groove formed on one of said first and second support members,
wherein said first actuator vibrates at least one of the positioning member and the groove.

4. An exposure apparatus according to claim 3, further comprising:
an optical system that includes the optical elements;
an aberration measurement mechanism for measuring aberration of the optical system,
wherein said actuator drives said first support member based on a measurement result of said aberration measurement mechanism.

5. An exposure apparatus according to claim 3, further comprising:
a second actuator that drives said first support member relative to said second support member,
wherein a minimum unit of a driving amount by said first actuator is smaller than that of said second actuator.

6. An exposure apparatus according to claim 3, further comprising:
a second actuator that drives said first support member relative to said second support member,
wherein a drivable range of said first actuator is narrower than that of said second actuator.

7. A device fabrication method comprising the steps of:
exposing a plate using an exposure apparatus according to claim 3; and
developing the plate that has been exposed.

8. An exposure apparatus for introducing light from a light source to an object to be exposed, said exposure apparatus comprising:
a plurality of optical elements;
a first support member that supports one of said optical elements;
a second support member that supports said first support member;
an actuator that drives said first support member relative to said second support member, and
a positioning part that positions said first support member relative to said second support member, wherein said positioning part removably attaches said first support member to said second support member, and said positioning part including a positioning member and a groove formed on one of said first and second support members,
wherein said actuator vibrates at least one of the positioning member and the groove.

9. A support apparatus comprising:
a single optical element;
a first actuator that drives said optical element;

a first support member that supports said optical element via said first actuator, said first support member supporting said first actuator;

a second actuator that drives said first support member;

a second support member that supports said first supporting element via said second actuator, and a positioning part that positions said first support member relative to said second support member, said positioning part removably attaches said first support member to said second support member, wherein said positioning part includes a groove formed on one of said first actuator and said first support member, and a positioning member provided on the other, said positioning member being disposed in said groove, and wherein at least one of said first actuator and second actuator vibrates at least one of the positioning member and the groove.

10. A support apparatus comprising:

a single optical element;

a first actuator that drives said optical element;

a first support member that supports said optical element via said first actuator, said first support member supporting said first actuator;

a second actuator that drives said first support member;

a second support member that supports said first supporting element via said second actuator, and a positioning part that positions said first support member relative to said second support member, said positioning part removably attaches said first support member to said second support member, wherein said positioning part includes a groove formed on one of said first support member and said second actuator, and a positioning member provided on the other, said positioning member being disposed in said groove, and wherein at least one of said first actuator and second actuator vibrates at least one of the positioning member and the groove.

11. A support apparatus comprising:

a single optical element;

a first actuator that drives said optical element;

a first support member that supports said optical element via said first actuator, said first support member supporting said first actuator;

a second actuator that drives said first support member;

a second support member that supports said first supporting element via said second actuator, and a positioning part that positions said first support member relative to said second support member, said positioning part removably attaches said first support member to said second support member, wherein said positioning part includes a groove formed on one of said second actuator and said second support member, and a positioning member provided on the other, said positioning member being disposed in said groove, and wherein at least one of said first actuator and second actuator vibrates at least one of the positioning member and the groove.

* * * * *